(12) United States Patent
Hashimoto

(10) Patent No.: US 6,511,315 B2
(45) Date of Patent: Jan. 28, 2003

(54) SUBSTRATE PROCESSING APPARATUS

(75) Inventor: Koji Hashimoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/047,604

(22) Filed: Jan. 16, 2002

(65) Prior Publication Data

US 2002/0098458 A1 Jul. 25, 2002

(30) Foreign Application Priority Data

Jan. 19, 2001 (JP) ........................................ 2001-011345

(51) Int. Cl.7 ................................................. F27D 3/00
(52) U.S. Cl. .............................. 432/121; 432/5; 432/6; 432/11; 414/937; 414/940; 414/222.13; 118/66
(58) Field of Search ............................... 432/121, 5, 6, 432/11; 414/222.04, 222.13, 935, 937, 940, 941; 118/724, 725, 66

(56) References Cited

U.S. PATENT DOCUMENTS 6,051,101 A * 4/2000 Ohtani et al. ............... 156/345
6,099,643 A * 8/2000 Ohtani et al. ............... 118/319

FOREIGN PATENT DOCUMENTS

| JP | 635523 | 1/1988 |
| JP | 10284568 | 10/1998 |

OTHER PUBLICATIONS

English translation of Abstract for Japanese Patent No. 63–5523 dated Jan. 11, 1988.
English translation of Abstract for Japanese Patent No. 10–284568 dated Oct. 23, 1998.

* cited by examiner

Primary Examiner—Jiping Lu
(74) Attorney, Agent, or Firm—Ostrolenk, Faber, Gerb & Soffen, LLP

(57) ABSTRACT

In a substrate processing apparatus, processing units are stacked in a multistage manner around a transport robot arranged at the center of a processing area for forming a processing part. In a second hierarchy, rotary coating units are arranged through an indexer and a transport robot. In a fourth hierarchy located above the second hierarchy, rotary developing units are stacked above the rotary coating units respectively. Multistage thermal processing units and an edge exposure unit are horizontally arranged above an interface mechanism part. Thus, a substrate processing apparatus capable of reducing the area for setting the same is provided.

5 Claims, 7 Drawing Sheets

SUBSTRATE PROCESSING APPARATUS

BACKGROUND OF THE INVENTION

1. Field of the Invention

The present invention relates to a substrate processing apparatus performing a series of processing steps such as thermal processing, chemical processing and the like on a thin-plate substrate (hereinafter simply referred to as "substrate") such as a semiconductor substrate or a glass substrate for a liquid crystal display.

2. Description of the Background Art

A substrate processing apparatus is employed for performing various processing steps on a substrate such as a semiconductor wafer, a glass substrate for a liquid crystal display, a glass substrate for a photomask or a glass substrate for an optical disk. In a process for manufacturing a semiconductor device, for example, a substrate processing apparatus formed by unitizing the respective ones of a series of processing and integrating a plurality of processing units with each other is employed.

The substrate processing apparatus transports the substrate by a transport robot between a heating part performing prescribed heating on the substrate, a cooling part cooling the substrate and a chemical processing part performing chemical processing, and performs the series of substrate processing in prescribed order. Such a substrate processing apparatus is generally set in a clean room managed in temperature, humidity and particles.

FIG. 7 is a conceptual plan view typically showing exemplary arrangement of processing units in a conventional substrate processing apparatus. The substrate processing apparatus shown in FIG. 7 has processing parts 110 and 120 and a transport area 130. A rotary coating unit (spin coater) 111 applying a processing liquid to substrates and a rotary developing unit (spin developer) 112 developing the substrates are arranged on the processing part 110 in parallel with each other.

A plurality of stages of heating units (hot plates) HP and cooling units (cooling plates) CP for heating and cooling the substrates respectively are arranged on the processing part 120. A transport unit 131 for transferring the substrates is provided on the transport area 130. An introduction/discharge apparatus (indexer) 140 storing substrates W while introducing and discharging the substrates W is arranged on single sides of the processing parts 110 and 120 and the transport area 130.

The introduction/discharge apparatus 140 comprises a plurality of cassettes 141 storing the substrates W and a transfer robot 142 introducing and discharging the substrates W. The transfer robot 142 of the introduction/discharge apparatus 140 moves along arrow U, takes out the substrates W from the cassettes 141 for transferring the same to a transport unit 131, and receives the substrates W subjected to the series of processing from the transport unit 131 for returning the same to the cassettes 141. The transport unit 131 transports the substrates W along arrow S in the transport area 130, introduces/discharges the substrates W into/from the aforementioned respective processing units, and transfers/receives the substrates W to/from the transfer robot 142.

The diameters of substrates are recently increasingly enlarged for improving productivity, such that substrates having diameters exceeding 300 mm are also in the processing of handling. If the substrates are increased in size, the processing parts for processing the same are also increased in size, resulting in a size increase of the overall substrate processing apparatus as well as the set area (hereinafter referred to as "footprint") occupied by the substrate processing apparatus in plane. In consideration of management of the clean room, however, such size increase of the substrate processing apparatus is disadvantageous.

This is because the environmental maintenance cost is increased when the footprint of the substrate processing apparatus is increased. Specific equipment such as a hygrothermal control unit or a filter is required in order to retain a clean internal atmosphere of the substrate processing apparatus for maintaining the clean room. Thus, the material cost and the maintenance cost for the filter or the like are disadvantageously increased. In particular, a high-priced chemical filter for coping with chemically amplified resist or the like may recently be required, and hence the material cost and the maintenance cost are remarkably increased if the area for using the chemical filter is increased.

Further, a single substrate processing apparatus recently carries a number of processing units for efficiently processing a large number of substrates. Therefore, a substrate processing apparatus allowing effective use of a space in the clean room is awaited. In order to suppress increase of the footprint of the substrate processing apparatus, therefore, a substrate processing apparatus formed by stacking the aforementioned processing units upward in a multistage manner is proposed and now in the process of usage.

However, it follows that an interface mechanism part transferring/receiving substrates to/from a stepper assembled with the aforementioned substrate processing apparatus is separately arranged on this apparatus. This interface mechanism part also has the problem that respective parts thereof are increased in size to increase the overall size of the interface mechanism part when the size of the substrates is increased, disadvantageously leading to increase the footprint thereof similarly to the substrate processing apparatus.

SUMMARY OF THE INVENTION

The present invention is directed to a substrate processing apparatus performing processing consisting of a plurality of stages on a substrate.

A substrate processing apparatus according to the present invention, performing processing consisting of a plurality of steps on a substrate, comprises a transport path extending substantially along the vertical direction, a plurality of processing parts arranged around the transport path so that some of the plurality of processing parts comprise a plurality of processing units stacked substantially in the vertical direction for performing prescribed processing on the substrate, a main transport robot arranged on the transport path for introducing/discharging the substrate into/from the plurality of processing parts while moving along the transport path, and an interface provided for the plurality of processing parts for transferring/receiving the substrate to/from an external device.

The interface is arranged for the processing parts, whereby the area for setting the substrate processing apparatus can be reduced.

According to a preferred embodiment of the present invention, a specific processing part included in the plurality of processing parts and the interface are stacked substantially along the vertical direction.

The processing part and the interface are stacked along the vertical direction, whereby the area for setting the substrate processing apparatus can be reliably reduced.

Accordingly, an object of the present invention is to provide a substrate processing apparatus capable of reducing the area for setting the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the substrate processing apparatus according to the present invention are now described with reference to the drawings.

The embodiments are now described with reference to the drawings.

First Embodiment

Figure 1:
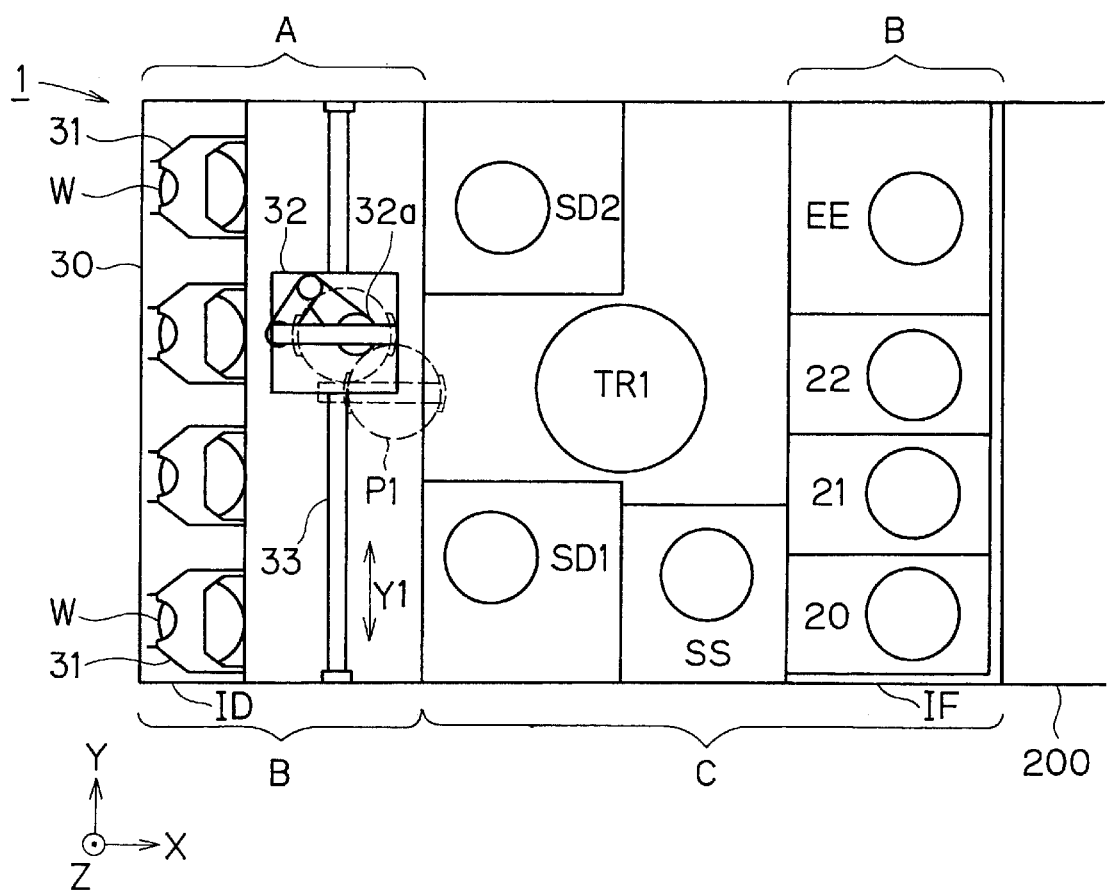
FIG. 1 is a plan view illustrating a substrate processing apparatus according to a first embodiment of the present invention.
Figure 2:
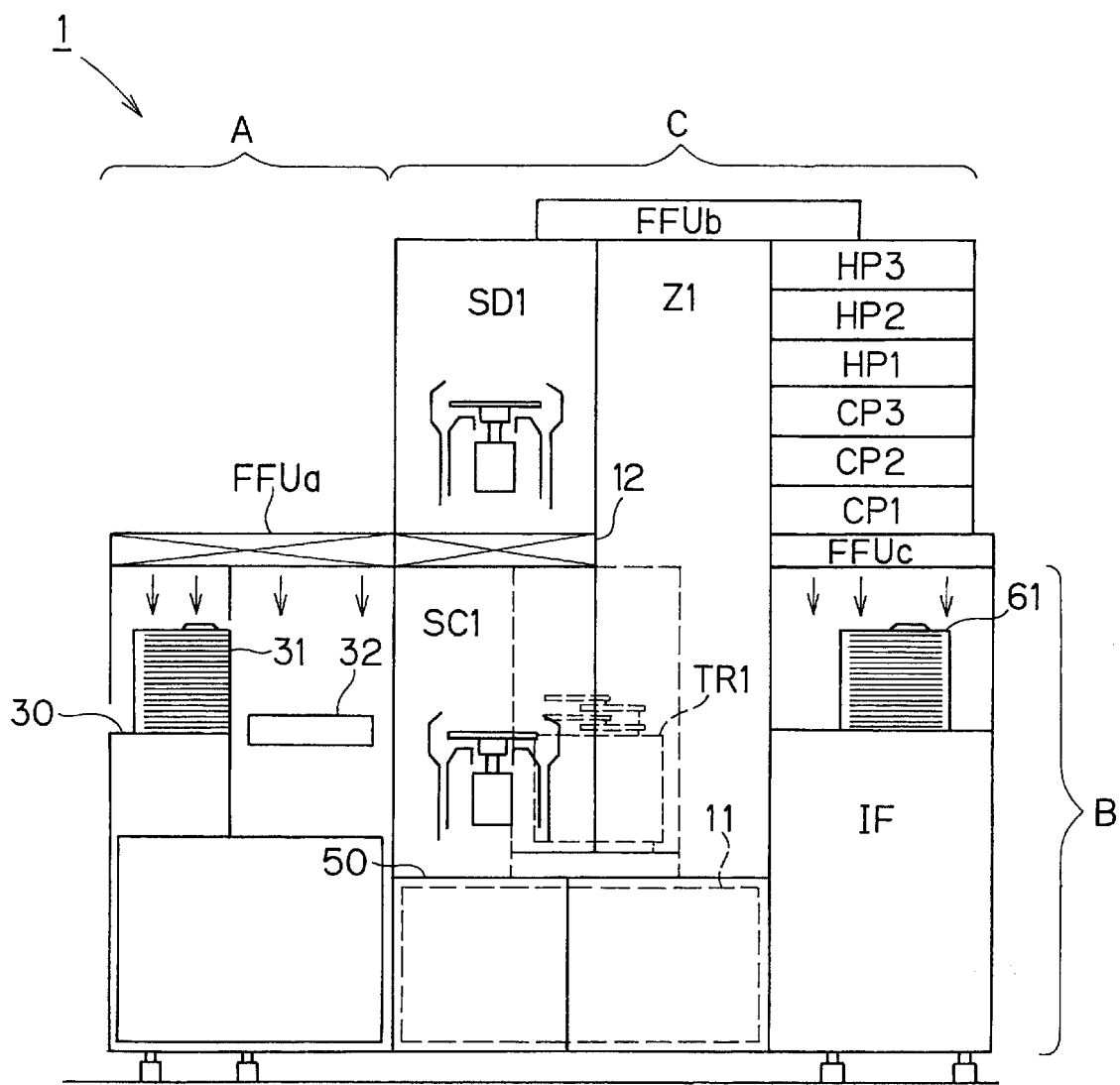
FIG. 2 is a front elevational view illustrating the substrate processing apparatus according to the first embodiment of the present invention.

The overall structure of a substrate processing apparatus 1 according to a first embodiment of the present invention is now described. FIGS. 1 and 2 illustrate the substrate processing apparatus 1 according to the first embodiment. FIG. 1 is a plan view of the substrate processing apparatus 1, and FIG. 2 is a front elevational view of the apparatus 1. X-Y-Z Cartesian coordinate systems are assigned to FIG. 1, in order to clarify the directional relation thereof. It is assumed that the horizontal plane parallel to the floor face is the X-Y plane, and the vertical direction is the Z-direction.

Referring to FIG. 1, the substrate processing apparatus 1 is roughly classified into a substrate introduction/discharge area A and a processing area C including a transfer area B transferring/receiving substrates W to/from a stepper 200 assembled with this apparatus 1. The structures of the respective parts are now described.

The introduction/discharge area A is formed by an indexer ID, which comprises a plurality of (four in this embodiment) cassettes 31, storing the substrates W, placed on a base 30 and a transfer robot 32 introducing/discharging the substrates W between the cassettes 31 and a prescribed substrate transfer position P1. The cassettes 31 can store the substrates W in a multistage manner. The transfer robot 32 comprises a driving mechanism 33 along the Y-axis direction formed by a guide rail or the like as a whole, and is reciprocative on a transport path Y1 in the Y-direction along the transport path Y1 provided in the indexer ID. The transfer robot 32 further comprises a first arm 32a for supporting the substrates W on its upper end. This first arm 32a is vertically movable, longitudinally stretchably movable and rotatable about a vertical axis. A fan filter unit FFUa is arranged on this indexer ID.

This transfer robot 32 extends and raises the first arm 32a in a state opposed to the cassettes 31 thereby receiving desired substrates W from the cassettes 31, and contracts the first arm 32a thereby taking out the substrates W from the cassettes 31. The transfer robot 32 further moves the substrates W to the transfer position P1 for transferring the same to a transport robot TR1 described later, and receives the substrates W transported to the transfer position P1 by the transport robot TR1 for storing the same in the cassettes 31.

Figure 3:
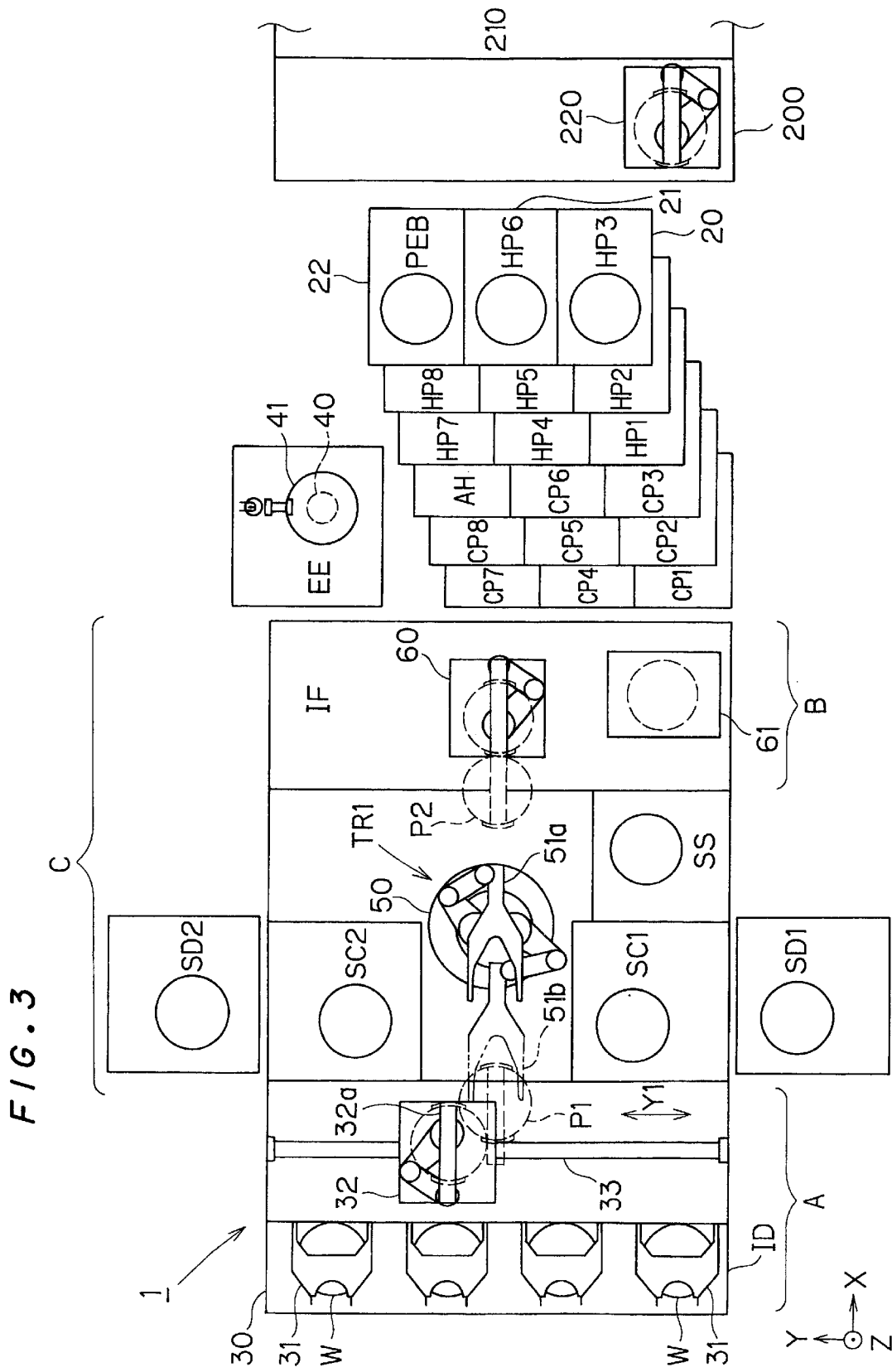
FIG. 3 illustrates arrangement of processing units forming the apparatus shown in FIG. 1.

The substrate processing apparatus 1 is described in more detail with reference to FIG. 3. FIG. 3 illustrates the arrangement structure of processing units shown in FIG. 1. FIG. 3 also illustrates transportation of the substrates W in the processing area C, transportation of the substrates W in the transfer area B, and transfer of the substrates W between the processing area C and the transfer area B.

A transport path Z1 extending in the vertical direction perpendicularly to the said transport path Y1 is arranged on the central portion of the processing area C. The transport robot TR1 is arranged for serving as a main transport mechanism transferring the substrates W along the transport path Z1. A plurality of processing parts processing the substrates W are radially arranged around the transport robot TR1. The processing parts include the transfer area B formed by an interface mechanism part IF for introducing/discharging the substrates W between the stepper 200 and the processing area C.

The transport robot TR1 is now described. The central portion of the processing area C has the transport path Z1 along which the transport robot TR1 vertically moves up to a fan filter unit FFUb forming a downflow of clean air. The transport robot TR1 accesses all peripheral processing units for transferring/receiving the substrates W to/from the same. This transport robot TR1 is vertically movable and rotatable about a central vertical axis. In other words, the transport robot TR1 is set on a base 50, and formed with a horizontal moving mechanism for horizontally moving a pair of transport arms 51a and 51b holding the substrates W, a vertical moving mechanism moving the same in the vertical direction and a rotation driving mechanism allowing rotation about the center of the base 50. The transport arms 51a and 51b are three-dimensionally movable due to these mechanisms. Thus, the transport arms 51a and 51b vertically move and swing in the transport path Z1.

The transport arms 51a and 51b rectilinearly move in the horizontal direction while maintaining postures with respect to the processing units respectively. When the transport arms 51a and 51b are alternately bent, it is possible to take out processed substrates W from a processing unit located in front of the same and introduce unprocessed substrates W into this processing unit.

Figure 4:
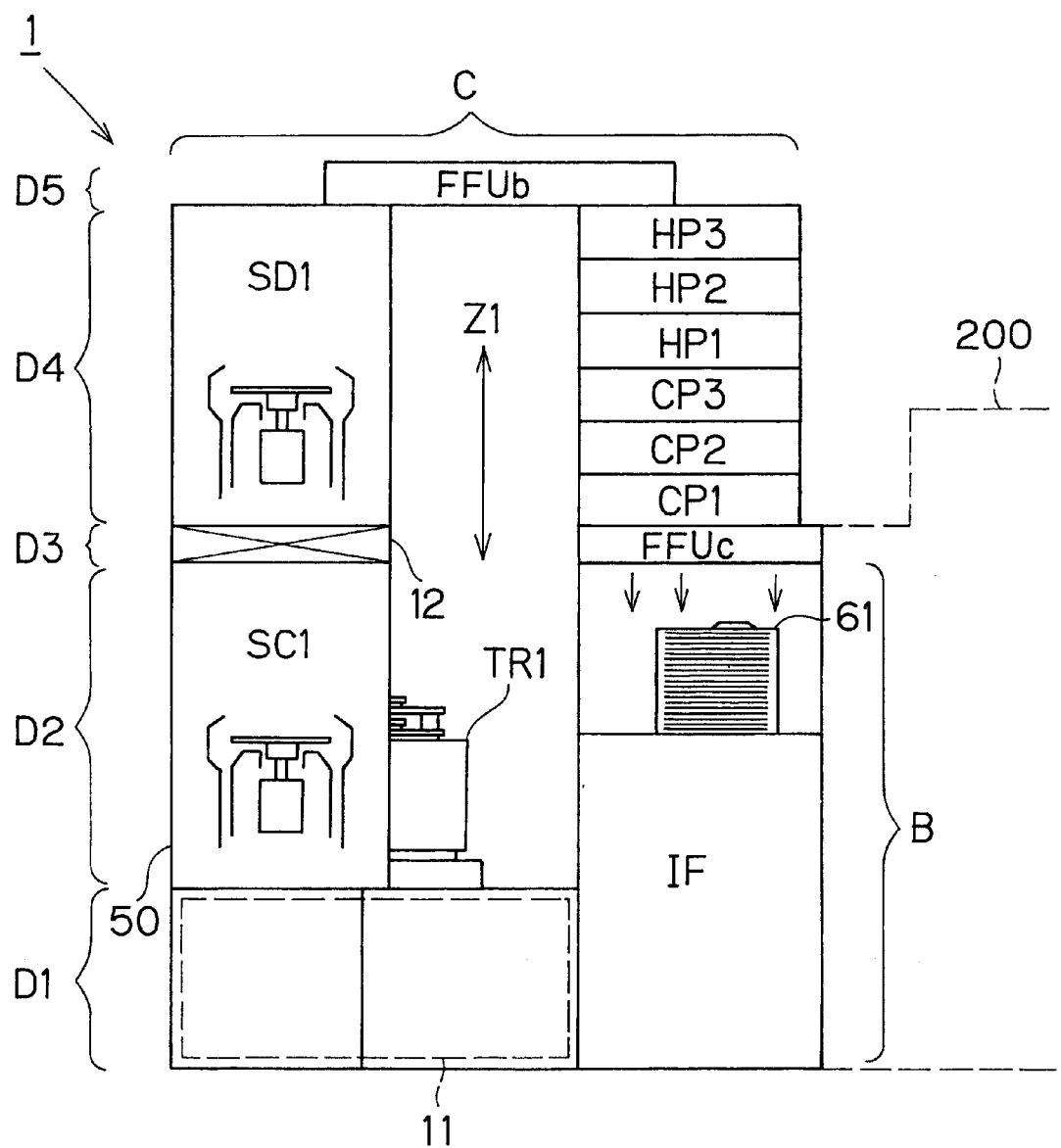
FIG. 4 is a front elevational view of a principal pat illustrating the substrate processing apparatus according to the first embodiment of the present invention.

As shown in FIG. 4, various processing units are stacked in five hierarchies D1 to D5 on one side (the left side in FIG. 4) of the transport path Z1 in the processing area C. A chemical unit 11 is arranged on the lowermost first hierarchy D1. The chemical unit 11 stores a chemical cabinet having tanks storing various types of processing solutions (chemical solutions) and a waste liquid and pipes, pumps and an exhaust system.

Rotary coating units (spin coaters) SC1 and SC2 applying a processing solution such as photoresist to the substrates W while rotating the substrates W are arranged on the second hierarchy D2 located on the first hierarchy D1 as processing units for processing the substrates W with the processing solution such that the transfer position P1 through which the substrates W are transferred between the transfer robot 32 and the transport robot TR1 is interposed between the rotary coating units SC1 and SC2.

An air conditioning unit 12 formed by a filter such as an ULPA (ultra low penetration air) filter or a chemical filter and a fan is arranged on the third hierarchy D3 above the rotary coating units SC1 and SC2.

Rotary developing units (spin developers) SD1 and SD2 developing the substrates W after exposure are arranged on the fourth hierarchy D4 above the coating units SC1 and SC2. Finally, the fan filter unit FFUb is set on the uppermost part of the processing area C as the fifth hierarchy D5, similarly to the transport path Z1.

As hereinabove described, the rotary coating units SC1 and SC2 are arranged between the transport robot TR1 and the indexer ID in front of and at the back of the apparatus 1. Above these rotary coating units SC1 and SC2, the rotary developing units SD1 and SD2 developing the exposed substrates W are stacked in the same unit set area respectively. The space between the front and rear stacked processing parts functions as the transfer position P1 for transferring the substrates W between the transport robot TR1 and the indexer ID.

Various processing units are stacked also on the other side (the right side in FIG. 4) of the transport path Z1 of the processing area C. The interface mechanism part IF transferring/receiving the substrates W to/from the stepper 200 forming the transfer area B is arranged on the lowermost portion. The interface mechanism part IF functions to temporarily stock the substrates W for transferring the substrates W completely coated with the resist in the processing area C to the stepper 200 and receiving the exposed substrates W from the stepper 200, and comprises a transport robot 60 for transferring/receiving the substrates W to/from the transport robot TR1 and a buffer cassette 61 receiving the substrates W therein.

The transport robot 60, which is vertically and horizontally movable and rotatable about a vertical axis, transfers the substrates W between the stepper 200 and the transport robot TR1. A filter fan unit FFUc forming a downflow of clean air is set also immediately above the interface mechanism part IF.

In relation to the interface mechanism part IF, the substrates W are exchanged on a transfer position P2. In other words, the transport robot TR1 moves the substrates W completely subjected to prescribed processing in the processing area C to the transfer position P2 and exchanges the substrates W between the same and the interface mechanism part IF.

On a hierarchy located on the interface mechanism part IF, three multistage thermal processing units 20, 21 and 22 of a six-stage structure performing thermal processing on substrates W are arranged in front of the apparatus 1 (the negative direction of the Y-direction), and an edge exposure unit EE is arranged at the back (the positive direction of the Y-direction).

Among the multistage thermal processing units 20, 21 and 23, the first multistage thermal processing unit 20 is provided with a cool plate part CP1 cooling the substrates W on the first-stage position from the lowermost stage, and cool plate parts CP2 and CP3 are similarly provided also as to the second and third stages. A hot plate part HP1 heating the substrates W is provided on the fourth stage, while hot plate parts HP2 and HP3 are similarly provided also as to the fifth- and sixth-stage positions.

In the second multistage thermal processing unit 21 located at the center, cool plate parts CP4 to CP6 are provided on the first- to third-stage positions from the lowermost stage, and hot plate parts HP4 to HP6 are provided on the fourth- to sixth-stage positions.

In the third multistage thermal processing unit 22, cool plate parts CP7 and CP8 are provided on first and second stage positions from the lowermost stage, an adhesion reinforcing part AH performing adhesion reinforcing processing on the substrates W is provided on a third stage, and hot plate parts HP7 and HP8 are provided on fourth and fifth stage positions. A post-exposure baking plate part PEB performing post-exposure baking on the substrates W is provided on the uppermost stage position.

The edge exposure unit EE comprises a substrate rotating/holding mechanism 40 holding and rotating the substrates W at a low speed, a light application part 41 applying light to the peripheral edges of the substrates W etc. Photoresist films are removed from the peripheral edges of the edge-exposed substrates W by later development, so that the photoresist films located on the peripheral edges of the substrates W are not peeled to disadvantageously form particles.

At the front end of the processing area C, a cleaning unit (spin scrubber) SS for supplying a washing solution such as pure water to the substrates W and rotating/washing the substrates W is arranged between the rotary coating unit SC1 and the interface mechanism part IF as a processing unit.

According to the aforementioned structure, the transport robot TR1 takes out substrates W cooled by the cool plate part CP4 in the fourth hierarch D4, for example, with the arm 51a and thereafter swings for taking out rotated substrates W from the rotary developing unit SD1 with the arm 51b and introducing the substrates W held in the arm 51a into the rotary developing unit SD1, whereby the substrate processing apparatus 1 can exchange the substrates W in the rotary developing unit SD1. The transport robot TR1 provided on the central portion of the processing area C successively transports the substrates W between the aforementioned liquid processing unit and thermal processing units, so that the substrates W can be subjected to prescribed processing.

The stepper 200 comprises an exposure part 210 exposing the substrates W formed with the resist films in the substrate processing apparatus 1 and a transport robot 220 transporting the substrates W between the exposure part 210 and the aforementioned interface mechanism part IF.

The rotary coating units SC1 and SC2, the rotary developing units SD1 and SD2, the cool plate parts CP1 to CP8, the hot plate parts HP1 to HP8, the adhesion reinforcing part AH, the post-exposure baking plate part PEB and the edge exposure unit EE correspond to the processing units. Further, the transport robot TR1 corresponds to a main transport mechanism.

Figure 5:
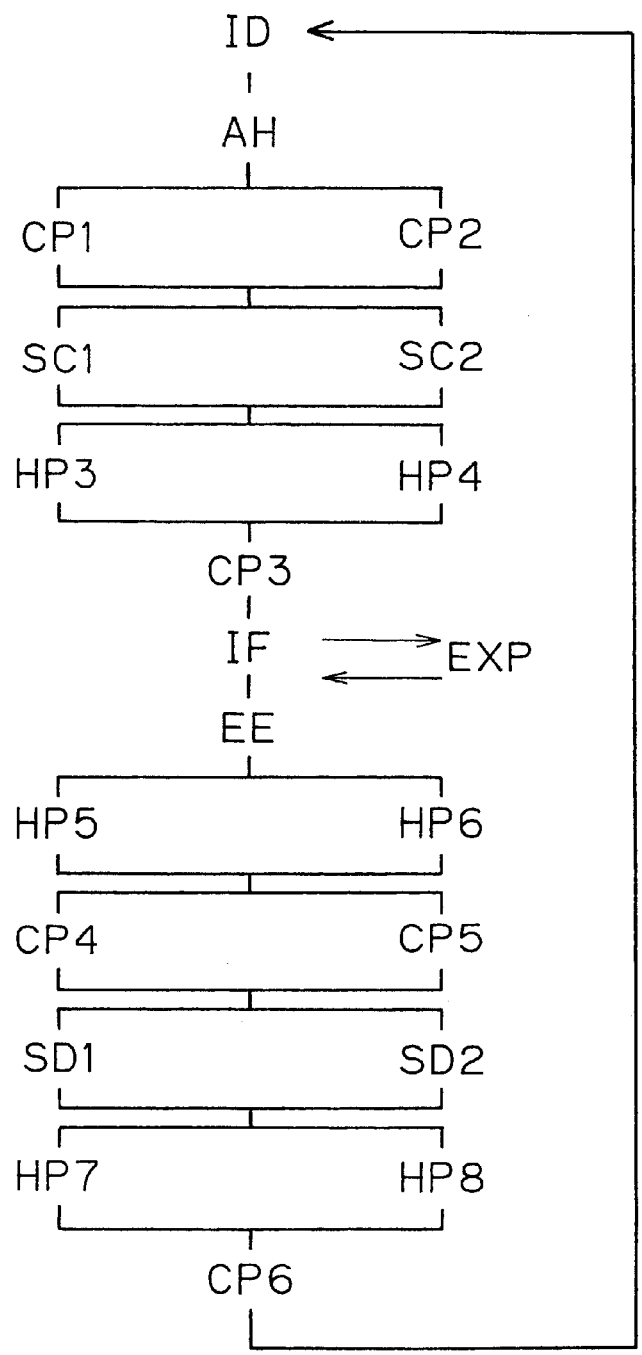
FIG. 5 is a flow chart showing the flow of substrates to respective processing units etc.

The flow of the substrate processing apparatus 1 shown in FIG. 1 for processing the substrates W is now described with reference to FIG. 5. FIG. 5 is a flow chart showing the flow of the substrates W to the processing units etc. Steps shown with aligned symbols in FIG. 5, such as "SC1, SC2", for example, mean that the substrates W are introduced into a vacant rotary coating unit and subjected to parallel processing (parallel processing of photoresist coating in this case) of the substrates W.

The transfer robot 32 of the indexer ID takes out an unprocessed substrate W from any cassette 31, and introduces this substrate W. The transfer robot TR1 receives the substrate W supplied to the transfer position P1. The transfer robot TR1 successively transports this substrate W to the adhesion reinforcing part AH, the cool plate part CP1 or CP2, the rotary coating unit SC1 or SC2, the hot plate part HP3 or HP4 and the cool plate part CP3.

The transport robot TR1 receiving the substrate W introduces the same into the adhesion reinforcing part AH, which in turn performs adhesion reinforcement processing on the substrate W. Thereafter the transport robot TR1 takes out the substrate W completely subjected to this adhesion reinforcement processing from the adhesion reinforcing part AH and transfers the same to the cool plate part CP1 or CP2. The cool plate part CP1 or CP2 receiving the substrate W cools the substrate W. When this cooling is terminated, the transport robot TR1 takes out the substrate W from the cool plate part CP1 or CP2 and transfers the same to the rotary coating unit SC1. The rotary coating unit SC1 rotatively applies the processing solution to the received substrate W. When this processing is terminated, the transfer robot TR1 takes out the substrate W from the rotary coating unit SC1 again, swings by 180° and transports the substrate W to the hot plate part HP3 or HP4. The hot plate part HP3 or HP4 heats the received substrate W. Thereafter the substrate W is transferred to the cool plate part CP3 and cooled.

The substrate W completely subjected to the aforementioned processing is transferred to the transport robot TR1 again, and transferred to the transport robot 60 through the transfer position P2. The substrate W transferred from the transport robot TR1 to the transport robot 60 is further transferred to the stepper 200 through the interface mechanism part IF.

The substrate W subjected to exposure of a circuit pattern or the like in the stepper 200 is transferred to the transport robot TR1 again through the interface mechanism part IF. The transport robot TR1 successively transports this substrate W to the edge exposure unit EE, the hot plate part HP5 or HP6, the cool plate part CP4 or CP5, the rotary developing unit SD1 or SD2, the hot plate part HP7 or HP8 and the cool plate part CP6.

In other words, the substrate W completely processed by the external stepper 200 is transferred to the transport robot 60, and supplied to the transfer position P2. Thereafter the transport robot TR1 transfers the substrate W to the rotary developing unit SD1 or SD2 through thermal processing in the hot plate part HP5 or HP6 and cooling in the cool plate part CP4 or CP5 after the exposure unit EE. The rotary developing unit SD1 or SD2 develops the substrate W. The transport robot TR1 transfers the completely developed substrate W to the hot plate part HP7 or HP8 and further transports the same to the cool plate part CP6 for cooling the substrate W.

The completely cooled substrate W is transferred to the transport robot TR1 again, and transferred to the transfer robot 32 through the transfer position P1. Then, the transfer robot 32 returns this substrate W to the cassette 31.

The substrate W subjected to the aforementioned processing is returned to the indexer ID and stored in the cassette 31. Similar processing is thereafter repetitively executed in units of the substrates W.

In the aforementioned substrate processing apparatus 1 according to the first embodiment, the rotary coating units SC1 and SC2 and the rotary developing units SD1 and SD2 are stacked, and the multistage thermal processing unit 20 and the edge exposure unit EE are stacked on the upper surface of the interface mechanism part IF and arranged on positions opposite to each other through the transfer robot TR1. Therefore, the area occupied by the substrate processing apparatus 1 is reduced as compared with a transport area having a horizontally movable transport unit. Thus, the footprint of the substrate processing apparatus 1 is reduced. Further, the space above the interface mechanism part IF is also utilized for improving planar arrangement efficiency for the processing units.

Second Embodiment

Figure 6:
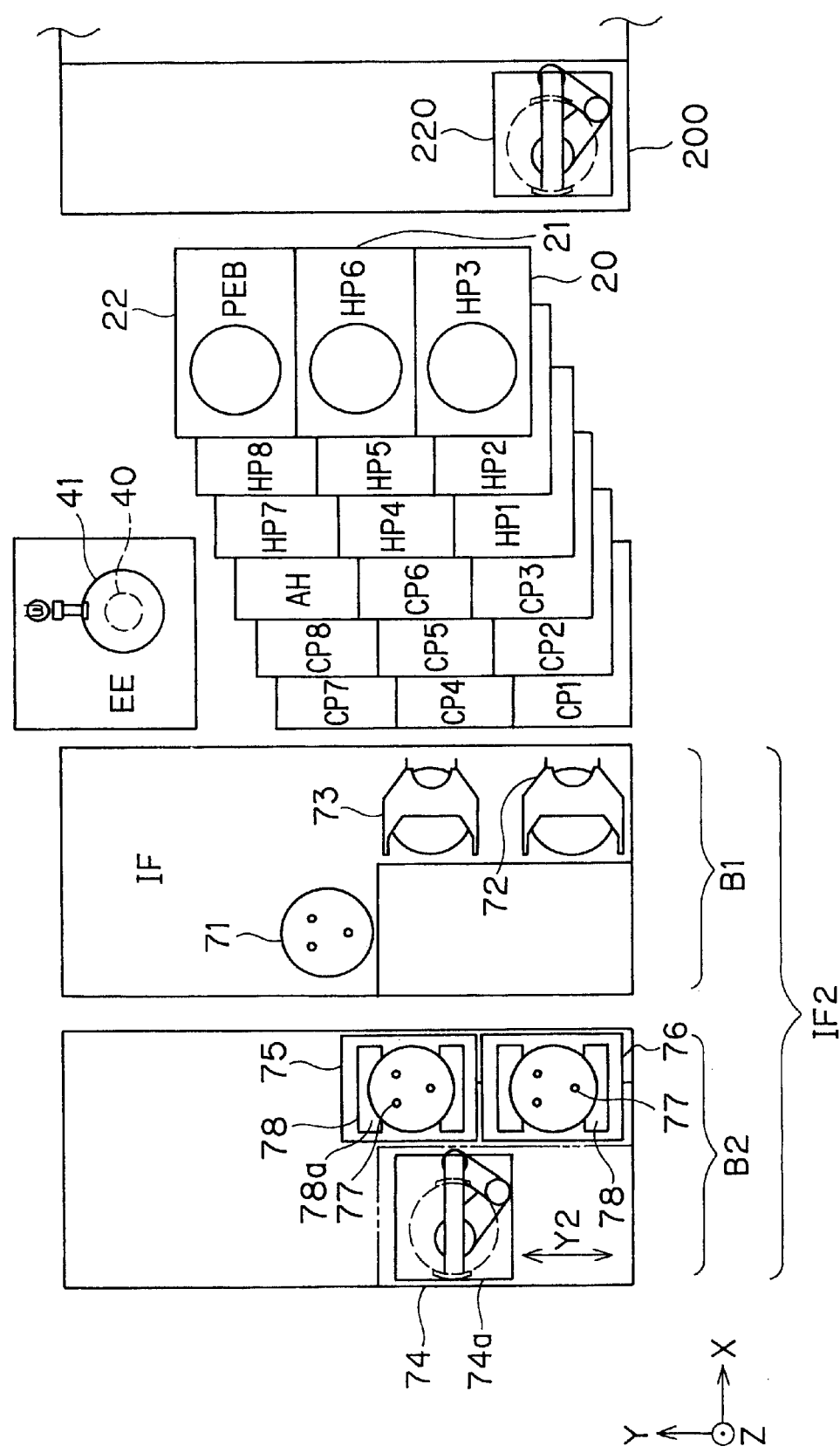
FIG. 6 is a diagram illustrating arrangement of processing units forming a substrate processing apparatus according to a second embodiment of the present invention.
Figure 7:
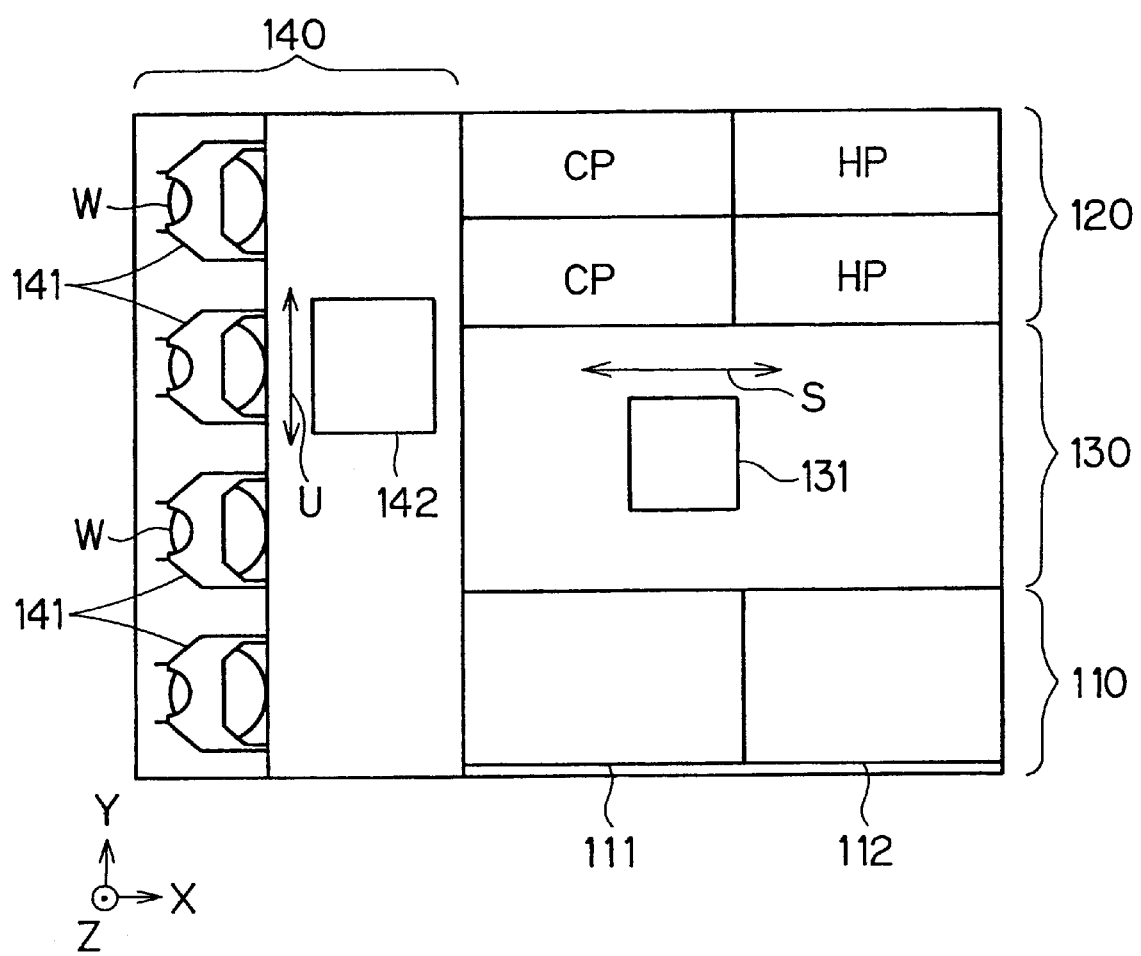
FIG. 7 is a conceptual plan view typically showing arrangement of processing units in a conventional substrate processing apparatus.

FIG. 6 is a plan view schematically showing the structure of a substrate processing apparatus according to a second embodiment of the present invention. Referring to FIG. 6, parts denoted by the same reference numerals as those in FIG. 1 are identical to those in the first embodiment, and hence redundant description is omitted. Characteristic parts of this embodiment are now described.

As shown in FIG. 6, an interface mechanism part IF2 is formed in two stages B1 and B2 in the vertical direction. The upper stage B1 is provided with a substrate transfer part 71 opposed to a transport path Z1 for transferring/receiving substrates W to/from a transport robot TR1 (not shown). The substrate transfer part 71 is provided with a plurality of support pins projecting from the upper surface of an upper floor. The substrates W transported by the transport robot TR1 are transferred to the upper ends of the support pins, or the transport robot TR1 receives the substrates W supported on the upper ends of the support pins and transports the same to respective processing units. Buffer cassettes 72 and 73 for bringing the substrates W exposed in a stepper 200 into a standby state are provided on a side portion (the lower side in FIG. 6) of the substrate transfer part 71.

A transport path Y2 is arranged on the lower stage B2 of the interface mechanism part IF2 in a direction perpendicular to the x-axis direction. A transport robot 74 is movably provided along this transport path Y2. The transport robot 74 transports the substrates W between the substrate transfer part 71 and exposure-feed and exposure-return tables 75 and 76 described later. The transport robot 74 comprises an arm 74a supporting the substrates W on its upper end. This arm 74a, vertically moving along the lower stage B2 and the upper stage B1 of the interface mechanism part IF2 and expanding/contracting along the longitudinal direction, and is formed to be rotatable.

The lower stage B2 of the interface mechanism part IF2 is provided with the exposure-feed table 75 for transferring the substrates W to the stepper 200 and the exposure-return table 76 for receiving the substrates W exposed by the stepper 200. Each of the tables 75 and 76 has a plurality of support pins 77 projecting from its upper end, for supporting the substrates W on the upper ends of the support pins 77. Further, each of the tables 75 and 76 comprises a substrate centering mechanism 78. The substrate centering mechanism 78 is so formed that a pair of guide plates 78a opposed to each other through the support pins 77 approach/sep to/from each other. Opposite edges of the guide plates 78a are arcuately formed in response to the substrates W, so that the guide plates 78a come into contact with the outer peripheral edges of the substrates W and align the substrates W with the center of each table 75 or 76 when approaching to each other.

In the apparatus according to the second embodiment having the aforementioned structure, the interface mechanism part IF2 has two hierarchies for transferring/receiving the substrates W to/from the stepper 200 on the lower stage B2. Consequently, thermal influence from a thermal processing unit arranged on the upper surface of the interface mechanism part IF2 is preferably blocked through the upper stage B1.

The present invention is not restricted to the aforementioned embodiments but can be modified and executed as follows:

(1) The arranged processing units are not restricted to the above but a positioning unit similar to the exposure-feed and exposure-return tables 75 and 76 may be separately provided. The edge exposure unit EE or the cleaning unit SS may be replaced with this positioning unit.

(2) In each of the aforementioned embodiments, the arrangement of the processing units is not restricted to the above but the rotary developing units SD1 and SD2 and the rotary coating units SC1 and SC2 may be replaced with each other to be arranged reversely to the arrangement shown in FIG. 3.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus performing processing consisting of a plurality of steps on a substrate, comprising:

a transport path extending substantially along the t\vertical direction;

a plurality of processing parts arranged around said transport path, some of said plurality of processing parts comprising a plurality of processing units stacked substantially in the vertical direction for performing prescribed processing on said substrate, a main transport robot arranged on said transport path, said main transport robot introducing/discharging said substrate into/from said plurality of processing parts while moving along said transport path; and an interface provided for said plurality of processing parts for transferring/receiving said substrate to/from an external device, wherein a specific processing part included in said plurality of processing parts and said interface are stacked substantially along the vertical direction.

2. The substrate processing apparatus according to claim 1, wherein said interface comprises a sub-transport robot transferring said substrate between said external device and said main transport robot.

3. The substrate processing apparatus according to claim 1, wherein said interface is arranged under said specific processing part.

4. The substrate processing apparatus according to claim 1 wherein said specific processing part includes a thermal processing part, and said thermal processing part comprises a plurality of thermal processing units each performing thermal processing on said substrate.

5. The substrate processing apparatus according to claim 4, wherein said interface comprises vertically stacked upper-stage and lower-stage parts, said sub-transport robot is arranged on said lower-stage part, and a buffer cassette temporarily bringing said substrate received from said external device into a standby state is arranged on said upper-stage part.

* * * * *